TUNABLE SUPERHETERODYNE SUPERREGENERATIVE RECEIVER
Filed March 13, 1948
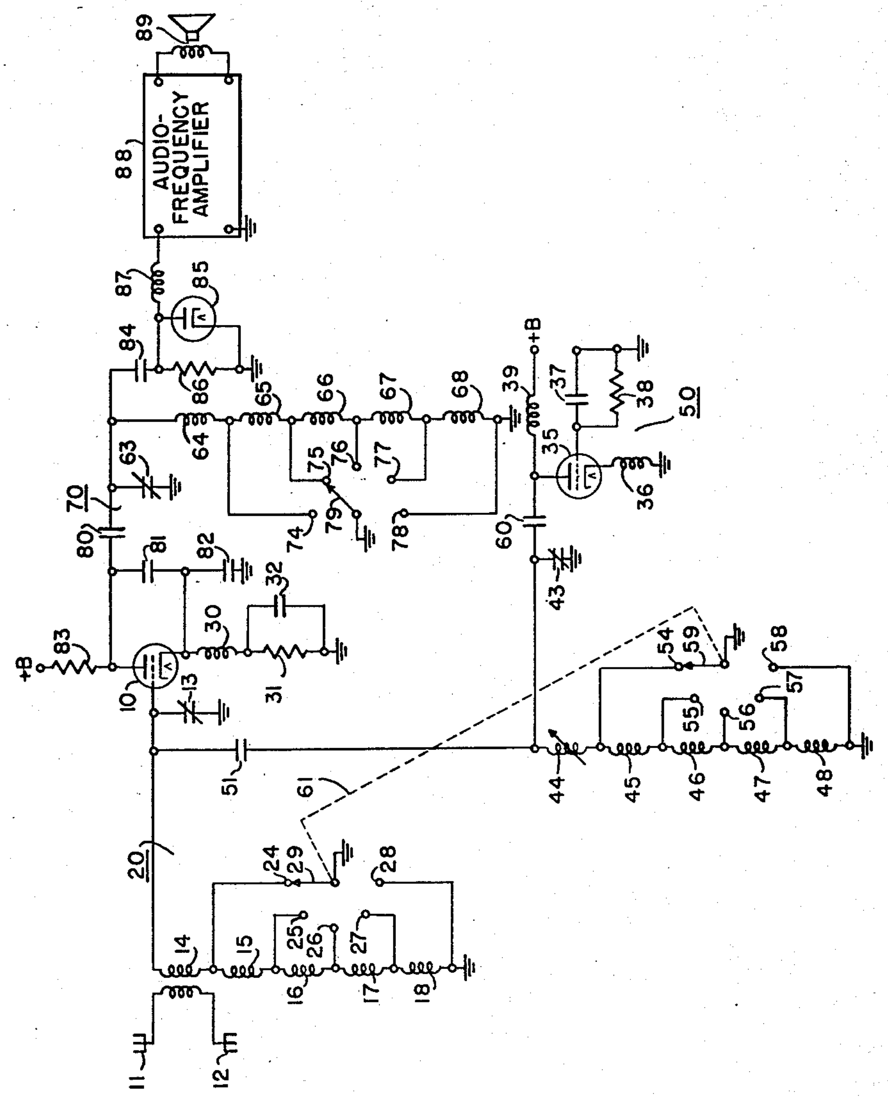
INVENTOR.
BERNARD D. LOUGHLIN
BY John A. Harvey
ATTORNEY Patented Sept. 2, 1952

2,609,492

UNITED STATES PATENT OFFICE 2,609,492

TUNABLE SUPERHETERODYNE SUPER-REGENERATIVE RECEIVER

Bernard D. Loughlin, Lynbrook, N. Y., assignor to Hazeltine Research, Inc., Chicago, Ill., a corporation of Illinois Application March 13, 1948, Serial No. 14,674

7 Claims. (Cl. 250—20)

This invention is directed to tunable wave-signal receivers of the superheterodyne super-regenerative type in which a received wave signal is subjected to a heterodyning process to derive a signal of an intermediate frequency for super-regenerative amplification. The invention relates particularly to so-called "decade tuning systems" which enable a receiver to be tuned selectively to any desired one of a large number of signal channels through the adjustment of a much smaller number of tuning controls. For example, with a decade tuning system having two independent ten-position adjustments it is possible selectively to tune to any desired one of one hundred different signal channels.

In the ordinary superheterodyne receiver, decade tuning may be achieved through the use of adjustments in the radio-frequency and heterodyning stages which select a discrete band of radio frequencies and adjustments in the intermediate-frequency stages for choosing any desired signal channel included within the selected frequency band. However, arrangements of that type have proved to be difficult to operate satisfactorily in view of the large number of selectors to be controlled and the necessity for accurate tracking within the receiver.

A decade tuned receiver heretofore proposed utilizes the principle of double superheterodyning with wide-band first intermediate-frequency stages for translating a band of frequencies including several signal channels and narrow-band second intermediate-frequency stages which accommodate a single signal channel at a time. One tuning adjustment controls the radio-frequency selectors and the first heterodyning oscillator to select a specific frequency band and thus a given group of signal channels. Another tuning adjustment controls the second heterodyning oscillator so that a desired one of those channels is converted to the second intermediate frequency for translation through the final stages of the receiver to the signal-reproducing device, such as a loudspeaker. Double superheterodyne receivers, however, are too costly and complicated for many installations.

The present invention takes advantage of the fact that in a superheterodyne superregenerative receiver, in which superregenerative amplification occurs at an intermediate frequency, it is possible to have the superregenerative circuit the predominant factor in determining the intermediate-frequency selectivity. Accordingly, one tuning adjustment for the heterodyning oscillator and another for the superregenerative circuit provide an effective and exceedingly simplified decade tuning system.

It is an object of the present invention, therefore, to provide a decade tuning system which avoids one or more of the aforementioned limitations of prior arrangements.

It is another object of the invention to provide a simplified and inexpensive decade tuning system for a wave-signal receiver.

It is a further object of the invention to provide a superheterodyne superregenerative receiver having an improved decade-type tuning system.

In accordance with the invention the wave-signal receiver is arranged selectively to translate carrier-wave signals received over any one of a series of preassigned frequency channels distributed within a plurality of frequency bands. The receiver is of the superheterodyne superregenerative type and comprises a superregenerative intermediate-frequency amplifier having an input selector tunable to each of the above-mentioned plurality of frequency bands for applying to the amplifier wave signals received within any of the above-mentioned bands and means, including a tunable oscillation generator coupled to the intermediate-frequency amplifier, for supplying to the aforesaid amplifier a heterodyning signal for use in converting carrier-wave signals included within any selected one of the plurality of frequency bands to a predetermined band of intermediate-frequency signals. A band-selecting tuning adjustment is provided for the generator, being variable in a plurality of discrete steps corresponding in number to the plurality of frequency bands for selecting any desired one of those band for frequency conversion. The receiver further comprises a regenerative oscillatory circuit included in the intermediate-frequency amplifier, and having a superregenerative selectivity characteristic with an acceptance band small relative to the intermediate-frequency band for causing the intermediate frequency amplifier selectively to amplify intermediate-frequency signals contained within the intermediate-frequency band. A signal-selecting tuning adjustment is provided for the regenerative oscillatory circuit for displacing its acceptance band resulting from said superregenerative selectivity characteristic throughout the band of intermediate frequencies effectively to select any desired one of the intermediate-frequency signals for superregenerative amplification.

For a better understanding of the present invention, together with other and further objects thereof, reference is had to the following description taken in connection with the accompanying drawing, and its scope will be pointed out in the appended claims.

The single figure of the drawing represents, partly schematically, a complete superheterodyne superregenerative wave-signal receiver embodying the present invention.

Referring now more particularly to the drawing, the superheterodyne superregenerative wave-signal receiver there represented is arranged selectively to translate carrier-wave signals received over any one of a series of preassigned frequency channels distributed in a common pattern within a plurality of radio-frequency bands. This receiver comprises a regenerative system including a single vacuum tube 10 of the triode type having anode, cathode, and control electrodes. A turnable input selector 20 constitutes means for applying to the regenerative system wave signals intercepted by an antenna system 11, 12 and received over any of the aforementioned plurality of radio-frequency bands. The input selector 20 includes an adjustable condenser 13 connected in parallel relation with an inductive reactance the magnitude of which is variable in discrete steps. The inductive reactance is supplied by a principal inductor 14 and a group of incremental inductors 15, 16, 17, and 18 connected in series therewith. The number of inductance elements corresponds with the plurality of radio-frequency bands to be selectively accepted by the input selector. In most decade tuning systems ten bands are contemplated, requiring ten inductance components in the tunable input selector but, for convenience of illustration, a lesser number has been represented in the drawing.

A tuning adjustment is provided for the input selector 20 for tuning that selector in discrete steps to accomplish the selection of a desired one of the several radio-frequency bands. The tuning adjustment, as represented, is in the form of a multiposition switch having terminals 24, 25, 26, 27, and 28, as well as a movable switch blade 29. The switch terminals connect to the several inductors in the manner indicated and the switch blade is grounded. One terminal of the selector 20 is directly connected with the control electrode of tube 10 and the opposite terminal thereof is grounded. The cathode of the tube is grounded through a radio-frequency choke 30 and a resistor 31 and is grounded for signal frequencies by a condenser 82 which completes the connections between the selector 20 and the input electrodes of the tube. A condenser 32 is connected across the cathode resistor 31 for a purpose to be described hereinafter.

In order to accomplish a heterodyning function, a tunable local oscillator 50 is also associated with the input electrodes of the regenerator tube 10 for supplying thereto a heterodyning signal for use in converting carrier-wave signals included within any selected radio-frequency band to a predetermined band of intermediate frequencies. This oscillator similarly includes a triode vacuum tube 35 having a cathode grounded through a radio-frequency choke 36 and having a control electrode grounded through a grid condenser 37 and a resistor 38. The anode of the tube 35 connects to a source of space current +B through a radio-frequency choke 39. The frequency-determining circuit of the heterodyning oscillator is similar in construction to the input selector 20 of the regenerative system. It includes an adjustable condenser 43 in parallel relation with an inductive reactance comprising a principal inductor 44 and series-connected incremental inductors 45, 46, 47, and 48. The number of inductors provided for this frequency-determining circuit is the same as that included in the input selector. A series of switch contacts 54–58, inclusive, and a blade 59 connect with the inductive components in the manner generally similar to that described in connection with the tuning adjustment of the input selector and constitute a tuning adjustment for the oscillator. One terminal of the frequency-determining circuit is connected through a condenser 60 to the anode of the tube 35 and the opposite terminal is grounded. The generator 50 is coupled to the regenerative system through a condenser 51.

The switch blades 29 and 59 of the tuning adjustments are mechanically interconnected for simultaneous or unicontrolled actuation as indicated by the broken line 61. As will be made more clear hereinafter, the tunable input selector 20 and the tunable local oscillator 50 in conjunction with the nonlinear signal-translating characteristic of the regenerative system comprise means for converting carrier-wave signals included within any selected one of the several available radio-frequency bands to a predetermined band of intermediate-frequency signals. The tuning adjustments permit a selection of a given one of the available bands for conversion to the predetermined band of intermediate frequencies.

The regenerative system including the tube 10 is also utilized as a tunable superregenerative amplifier which is the predominant factor in determining the intermediate-frequency selectivity of the receiver. For that purpose, the regenerative system further includes a resonant circuit 70 for establishing the free oscillation frequency of the system and for selectively responding to signals contained within the aforementioned band of intermediate-frequency signals. The resonant circuit 70 includes a condenser 63 in parallel relation with a principal inductor 64 and a series of incremental inductors 65, 66, 67, and 68. An additional multiposition switch, including contacts 74–78, inclusive, and a movable switch arm 79, provides a tuning adjustment for the resonant circuit similar to that of the input selector 20. The resonant circuit 70 further includes condensers 80, 81, and 82 and is connected between the anode electrode of the tube 10 and ground. The cathode of the tube is connected to the junction of the condensers 81 and 82 to complete the signal-frequency circuit of the regenerative system. A source of space current, indicated +B, is connected with the anode of the tube 10 through a resistor 83.

The output circuit of the tube 10 is connected through a coupling condenser 84 to a diode detector 85 having a load resistor 86. Signal potentials developed across the load resistor 86 are supplied through an intermediate-frequency and radio-frequency choke 87 to the input circuit of an audio-frequency amplifier 88 of any desired number of stages. A sound-signal reproduction device 89 is connected with the output circuit of the audio-frequency amplifier. The described receiver, featuring the use of a single tube regenerative system for effecting superheterodyne and subsequent superregenerative translation of received wave signals, is generally similar to that disclosed and claimed in Patent 2,588,022, granted March 4, 1952, entitled "Superregenerative Superheterodyne Wave-Signal Receiver." Reference may be had to that patent for a complete discussion of the operating principles of such a system which will be described here only briefly.

To facilitate the explanation, it will be assumed initially that the input selector 20 is tuned to accept a single received signal and that the oscillator 50 is suitably tuned to establish a desired intermediate-frequency signal by heterodyning of the received signal selected by the input selector. It will be further assumed that the resonant circuit 70 is fixed tuned to the resulting intermediate frequency presently to be explained more fully. For the assumed conditions a received amplitude-modulated radio-frequency wave signal intercepted by the antenna 11, 12 and supplied through the input selector 20 to the input electrodes of the tube 10 is mixed with the heterodyning signal delivered by the oscillator 50. This mixing action occurs within the tube 10 by virtue of its nonlinear operating characteristic, exhibited during certain conductive intervals thereof. As a result, there appears in the anode circuit of the tube 10 an intermediate-frequency signal which is modulated in accordance with the modulation of the received radio-frequency signal as in conventional heterodyning operation.

The derived intermediate-frequency signal is selected by the resonant circuit 70 and is amplified by the superregenerative circuit of the regenerative system. The superregenerative circuit is of the plate circuit self-quenching type and operates in the saturation or logarithmic mode. The conductance variations which are characteristic of superregenerative amplification are achieved in the following manner.

The condenser 80 is charged from the source +B through the anode resistor 83 and the inductance of the resonant circuit 70. When the charge on the condenser supplies a sufficiently high potential between the anode and cathode of the tube 10, the tube is rendered conductive and operates as an oscillation generator at the free oscillation frequency established by the resonant circuit 70. During the saturation interval, the space current of the tube is taken in large part from the condenser 80. When the charge on the condenser has been reduced to decrease the anode-cathode potential of the tube 10 to a low value, the tube becomes nonconductive. Accordingly, the characteristic negative-conductance intervals of the superregenerative circuit are those wherein the condenser 80 causes the tube 10 to be conductive, while the positive-conductance intervals are the intermediate ones in which the tube 10 is nonconductive. The elements 31 and 32 included in the cathode circuit of the tube 10 stabilize the superregenerative action.

As is characteristic of a self-quenching superregenerator to which an amplitude-modulated signal is applied, the quenching frequency and the occurrence frequency of the oscillations periodically generated vary in accordance with the modulation of the applied signal which, in the instant case, is the intermediate-frequency signal derived by the heterodyning action. These oscillations are supplied to the detector 85 which is arranged to function as an averaging detector of the intermediate-frequency signal to derive the modulation components for application to the audio-frequency amplifier 88 and reproduction by the sound-reproducing device 89.

At the start of each negative-conductance interval of the superregenerative circuit, the tube 10 exhibits a nonlinear signal-translating characteristic which enables the heterodyning process to be carried out. That process derives the intermediate-frequency signal which is then amplified by the superregenerative action.

Considering now more particularly the operation of the decade tuning system of the present invention, it is convenient to consider that there are one hundred signal channels available to which it is desired selectively to adjust the response to the superheterodyne superregenerative receiver. The hundred channels may be thought of as defining ten mutually exclusive radio-frequency bands with ten channels included in each such band. Also, the distribution of the ten channels within each band is in accordance with a common pattern or frequency allocation. The acceptance band of the input selector 20 when the switch blade 29 is in engagement with the first switch contact 24, as shown, is chosen to accept the first of the ten radio-frequency bands, containing the first ten signal channels. The operating frequency of the heterodyning oscillator 50 when its switch blade 59 engages the first switch contact 54 is such that the heterodyning signal supplied therefrom to the regenerative system enables that system to convert the accepted band of radio-frequency signals to a given band of intermediate-frequency signals. In like manner, positioning the switch blades 29 and 59 to any of the other switch contacts permits the operator to select any other of the available radio-frequency bands for conversion to the preselected band of intermediate frequencies. Accordingly, the heterodyning action establishes in the output circuit of tube 10 a fixed band of intermediate-frequency signals which includes each of the ten signal channels of an available band of radio-frequency signals chosen by selector 20 under the control of the tuning adjustment 61.

Discrimination as between the ten signal channels included in the intermediate-frequency band for any tuning adjustment of the input selector and the heterodyning oscillator is achieved by the selectivity of the resonant circuit 70. The resonant circuit 70 has a response or an acceptance band which is small relative to the band of intermediate frequencies developed by the heterodyning function. The switch blade 79 of the resonant circuit 70 displaces the acceptance band of the latter throughout the band of intermediate frequencies to enable the superregenerative circuit to select any desired one of the intermediate-frequency signals for superregenerative amplification. For example, if the first signal channel of the selected radio-frequency band is desired, the switch blade 79 is positioned to engage the switch contact 74, while the second signal channel of any selected band of radio frequencies may be chosen by placing the switch blade 79 in engagement with the second switch contact 75, as indicated in the drawing. Since the acceptance band of the resonant circuit 70 is small relative to the available band of intermediate frequencies, selective tuning of the resonant circuit causes the greatest response of the superregenerative system to a selected one of the available intermediate-frequency signals. In this manner, the tuning adjustment effectively singles out a desired signal channel for superregenerative amplification and for translation to the detector and final stages of the receiver.

Where the signal channels have the same distribution within the several radio-frequency bands and that distribution is known, it is expedient to have the tuning adjustment of the resonant circuit 70 arranged in the manner indicated to displace the acceptance band of the resonant circuit in discrete steps throughout the band of intermediate frequencies and in accordance with the distribution pattern of the signal channels within their respective radio-frequency bands. However, this is not essential and, if desired, a continuously adjustable tuning control may be provided for the resonant circuit 70.

It is desirable for optimum response of the receiver to have precise tuning adjustments of the heterodyning oscillator 50. For that purpose the incremental inductors 45–48, inclusive, may be fabricated to close tolerances. For economy of manufacture, it is convenient to have the incremental inductors 15–18, inclusive, the same as those of the heterodyning oscillator although it is not necessary to observe precise tuning of the input selector. Control of the tracking and the band of intermediate frequencies established at the several adjustments of the switches 29 and 59 may be exercised by providing suitable auxiliary adjustments for the input selector and the heterodyning oscillator. For example, the adjustable condenser 13 may be used to set the center frequency of the input selector. The condenser 43 is a corresponding center frequency adjustment for the heterodyning oscillator and the inductor 44 thereof may be adjustable to determine the range of the tuning steps. If the incremental inductors 65–68 of the resonant circuit 70 are held to reasonably close tolerances, the center frequency adjustment provided by the condenser 63 is generally adequate to attain the desired selectivity by tuning the superregenerative circuit because that circuit is usually operated at a much lower frequency than the heterodyning oscillator. Of course, the inductor 64 may also be adjustable to increase the degree of control.

Although the input selector 20 has been illustrated as a tunable circuit, it will be understood that an aperiodic input circuit may be employed for the regenerative system because, for any tuning adjustment of the heterodyning oscillator, only one band of received radio-frequency signals establishes a band of intermediate-frequency signals in the proper frequency range for acceptance by the selector 70 of the superregenerative circuit.

Although the receiver has been particularly described in connection with the reception of amplitude-modulated signals, it may be used equally well to receive frequency-modulated signals. The adaption of the receiver for the reception of frequency-mdoulated signals is explained in Patent 2,588,022 referred to previously.

By effecting superregenerative amplification at an intermediate-frequency, the intermediate-frequency selectivity is determined largely by the superregenerative circuit as already indicated. It may be shown that the selectivity, resulting from the use of the superregenerative stage is much greater than that of its resonant circuit 70. For this reason, the decade tuning system of the present invention provides a simplification because only two tuning adjustments are necessary, one for controlling the operating frequency of the heterodyning oscillator and the other for tuning the superregenerative amplifier. Since it is not necessary simultaneously to adjust a multiplicity of selectors, decade tuning is realized through an inexpensive and mechanically simple tuning arrangement.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A superheterodyne superregenerative receiver for selectively translating carrier-wave signals received over any one of a series of preassigned frequency channels distributed within a plurality of frequency bands comprising: a regenerative system having a nonlinear translating characteristic and including an input selector tunable to each of said plurality of frequency bands for applying to said system wave signals received over any of said bands; a tunable oscillation generator coupled to said system for applying thereto a heterodyning signal; a tuning adjustment for said generator variable in a plurality of discrete steps corresponding in number to said plurality of bands for selecting any desired one of said bands for conversion in said system to a predetermined band of intermediate-frequency signals; a resonant circuit, having a response band small relative to said intermediate-frequency band, included in said system for determining the free oscillation frequency thereof and for selectively responding to signals contained within said intermediate-frequency band; a tuning adjustment for said resonant circuit for displacing said response band throughout said band of intermediate frequencies; and means for controlling the conductance characteristic of said system to provide superregenerative amplification of the intermediate-frequency signal selected by said resonant circuit.

2. A superheterodyne superregenerative receiver for selectively translating carrier-wave signals received over any one of a series of preassigned frequency channels distributed within a plurality of frequency bands comprising: a single tube regenerative system having a nonlinear translating characteristic and including an input selector tunable to each of said plurality of frequency bands for applying to said system wave signals received over any of said bands; a tunable oscillation generator coupled to said system for applying thereto a heterodyning signal; a tuning adjustment for said generator variable in a plurality of discrete steps corresponding in number to said plurality of bands for selecting any desired one of said bands for conversion in said system to a predetermined band of intermediate-frequency signals; a resonant circuit, having a response band small relative to said intermediate-frequency band, included in said system for determining the free oscillation frequency thereof and for selectively responding to signals contained within said intermediate-frequency band; a tuning adjustment for said resonant circuit for displacing said response band throughout said band of intermediate frequencies; and means for controlling the conductance characteristic of said system to provide superregenerative amplification of the intermediate-frequency signal selected by said resonant circuit.

3. A superheterodyne superregenerative receiver for selectively translating carrier-wave signals received over any one of a series of preassigned frequency channels distributed within a plurality of frequency bands comprising: a regenerative system having a nonlinear translating characteristic and including an input selector tunable to each of said plurality of frequency bands for applying to said system wave signals received over any of said bands; a tunable oscillation generator coupled to said system for applying thereto a heterodyning signal; a tuning adjustment for said generator variable in a plurality of discrete steps corresponding in number to said plurality of bands for selecting any desired one of said bands for conversion in said system to a predetermined band of intermediate-frequency signals; a resonant circuit, having a response band small relative to said intermediate-frequency band, included in said system for determining the free oscillation frequency thereof and for selectively responding to signals contained within said intermediate-frequency band; a tuning adjustment for said resonant circuit for displacing said response band throughout said band of intermediate frequencies; and self-quenching means included within said system for controlling the conductance characteristic thereof to provide superregenerative amplification of the intermediate-frequency signal selected by said resonant circuit.

4. A superheterodyne superregenerative receiver for selectively translating carrier-wave signals received over any one of a series of preassigned frequency channels distributed within a plurality of frequency bands comprising: a superregenerative intermediate-frequency amplifier having an input selector tunable to each of said plurality of frequency bands for applying to said amplifier wave signals received within any of said bands; means, including a tunable oscillation generator coupled to said intermediate-frequency amplifier, for supplying to said amplifier a heterodyning signal for use in converting carrier-wave signals included within any selected one of said bands to a predetermined band of intermediate-frequency signals; a band-selecting tuning adjustment for said generator variable in a plurality of discrete steps corresponding in number to said plurality of bands for selecting any desired one of said bands for conversion; a regenerative oscillatory circuit included in said intermediate-frequency amplifier and having a superregenerative selectivity characteristic with an acceptance band small relative to said intermediate-frequency band for causing said intermediate-frequency amplifier selectively to amplify intermediate-frequency signals contained within said intermediate-frequency band; and a signal-selecting tuning adjustment for said regenerative oscillatory circuit for displacing said acceptance band resulting from said superregenerative selectivity characteristic throughout said band of intermediate frequencies effectively to select any desired one of said intermediate-frequency signals for amplification.

5. A superheterodyne superregenerative receiver for selectively translating carrier-wave signals received over any one of a series of preassigned frequency channels distributed in a common pattern within a plurality of frequency bands comprising: a superregenerative intermediate-frequency amplifier having an input selector tunable to each of said plurality of frequency bands for applying to said amplifier wave signals received within any of said bands; means, including a tunable oscillation generator coupled to said intermediate-frequency amplifier, for supplying to said amplifier a heterodyning signal for use in converting carrier-wave signals included within any selected one of said bands to a predetermined band of intermediate-frequency signals; a band-selecting tuning adjustment for said generator variable in a plurality of discrete steps corresponding in number to said plurality of bands for selecting any desired one of said bands for conversion; a regenerative oscillatory circuit included in said intermediate-frequency amplifier and having a superregenerative selectivity characteristic with an acceptance band small relative to said intermediate-frequency band for causing said intermediate-frequency amplifier selectively to amplify intermediate-frequency signals contained within said intermediate-frequency band; and a signal-selecting tuning adjustment for said regenerative oscillatory circuit variable in discrete steps to displace said acceptance band resulting from said superregenerative selectivity characteristic throughout said band of intermediate frequencies in accordance with said pattern effectively to select any desired one of said intermediate-frequency signals for amplification.

6. A superheterodyne superregenerative receiver for selectively translating carrier-wave signals received over any one of a series of preassigned frequency channels distributed within a plurality of frequency bands comprising: a superregenerative intermediate-frequency amplifier having an input selector tunable to each of said plurality of frequency bands for applying to said amplifier wave signals received within any of said bands; means, including a tunable oscillation generator coupled to said intermediate-frequency amplifier, for supplying to said amplifier a heterodyning signal for use in converting carrier-wave signals included within any selected one of said bands to a predetermined band of intermediate-frequency signals; unicontrolled band-selecting tuning adjustments for said selector and for said generator variable in a plurality of discrete steps corresponding in number to said plurality of bands for selecting any desired one of said bands for conversion; a regenerative oscillatory circuit included in said intermediate-frequency amplifier and having a superregenerative selectivity characteristic with an acceptance band small relative to said intermediate-frequency band for causing said intermediate-frequency amplifier selectively to amplify intermediate-frequency signals contained within said intermediate-frequency band; and a signal-selecting tuning adjustment for said regenerative oscillatory circuit for displacing said acceptance band resulting from said superregenerative selectivity characteristic throughout said band of intermediate frequencies effectively to select any desired one of said intermediate-frequency signals for amplification.

7. A superheterodyne superregenerative receiver for selectively translating carrier-wave signals received over any one of a series of preassigned frequency channels distributed within a plurality of frequency bands comprising: a superregenerative intermediate-frequency amplifier predominantly determining the intermediate-frequency selectivity of said receiver and having an input selector tunable to each of said plurality of frequency bands for applying to said amplifier wave signals received within any of said bands; means, including a tunable oscillation generator coupled to said intermediate-frequency amplifier, for supplying to said amplifier a heterodyning signal for use in converting carrier-wave signals included within any selected one of said bands to a predetermined band of intermediate-frequency signals, a band-selecting tuning adjustment for said generator variable in a plurality of discrete steps corresponding in number to said plurality of bands for selecting any desired one of said bands for conversion; a regenerative oscillatory circuit included in said intermediate-frequency amplifier, and having a superregenerative selectivity characteristic with an acceptance band small relative to said intermediate-frequency band and effective to cause said intermediate-frequency amplifier selectively to amplify intermediate-frequency signals contained within said intermediate-frequency band; and a signal-selecting tuning adjustment for said regenerative oscillatory circuit for displacing said acceptance band resulting from said superregenerative selectivity characteristic throughout said band of intermediate-frequencies effectively to select any desired one of said intermediate-frequency signals for amplification.

BERNARD D. LOUGHLIN.

REFERENCES CITED

The following references are of record in the file of this patent:

UNITED STATES PATENTS

| Number | Name | Date |
|---|---|---|
| 1,917,113 | Gunther | July 4, 1933 |
| 2,100,605 | Linsell | Nov. 30, 1937 |
| 2,148,287 | Becker | Feb. 21, 1939 |
| 2,209,959 | Chittick et al. | Aug. 6, 1940 |
| 2,215,775 | Banfield | Sept. 24, 1940 |
| 2,451,291 | Koch | Oct. 12, 1948 |